US012681106B2

(12) United States Patent
Cox

(10) Patent No.: US 12,681,106 B2
(45) Date of Patent: Jul. 14, 2026

(54) ELECTRIC CIRCUIT HEALTH INDICATOR AND EFFICIENCY IMPROVEMENT DEVICE AND METHOD

(71) Applicant: EATON INTELLIGENT POWER LIMITED, Dublin (IE)

(72) Inventor: Roger William Cox, McDonald, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 182 days.

(21) Appl. No.: 18/597,326

(22) Filed: Mar. 6, 2024

(65) Prior Publication Data

US 2025/0283955 A1     Sep. 11, 2025

(51) Int. Cl.
G01R 31/40      (2020.01)
G01R 19/02      (2006.01)
G01R 19/25      (2006.01)

(52) U.S. Cl.
CPC ............. G01R 31/40 (2013.01); G01R 19/02 (2013.01); G01R 19/25 (2013.01)

(58) Field of Classification Search
CPC ......... G01R 31/40; G01R 19/02; G01R 19/25
See application file for complete search history.

(56) References Cited

U.S. PATENT DOCUMENTS 7,463,985 B2     12/2008  Cox
10,867,087 B2 *  12/2020  Meagher ........... H02J 13/00001

| | | | |
|---|---|---|---|
| 11,614,508 B1 * | 3/2023 | Wang | G01R 33/561 |
| | | | 324/309 |
| 2003/0078742 A1 * | 4/2003 | VanderZee | G01R 21/006 |
| | | | 702/60 |
| 2005/0187725 A1 | 8/2005 | Cox | |
| 2006/0161648 A1 * | 7/2006 | Ding | H04L 67/535 |
| | | | 709/224 |
| 2010/0280774 A1 * | 11/2010 | Ewing | G01R 21/10 |
| | | | 702/85 |

(Continued)

OTHER PUBLICATIONS

European Patent Office "Extended European Search Report" for corresponding EP Application No. 25162155.3, dated Aug. 14, 2025, 6 pp.

*Primary Examiner* — Akm Zakaria
(74) *Attorney, Agent, or Firm* — Eckert Seamans Cherin & Mellott, LLC

(57)     ABSTRACT

A circuit health, efficiency and capacity (CHEC) monitor for use in an electrical power distribution system including a control panel connected to a 3-phase power source and a plurality of loads is provided. The CHEC monitor includes: a power parameters measurement component structured to measure power parameters of a power bus connected to the control panel; a metrics value calculator structured to receive the measured power parameters and determine metric values of a plurality of metrics over first periodic intervals; a metrics average calculator structured to obtain an average for each metric value over a second periodic interval; a metrics normalizer structured to normalize the average for each metric value and obtain a normalized metric index for each metric; a CHEC Index selector structured to select a maximum metric index from the normalized metric indexes; and a CHEC Index indicator structured to provide a latest CHEC Index.

18 Claims, 5 Drawing Sheets

(56)     References Cited

U.S. PATENT DOCUMENTS

| | | | |
|---|---|---|---|
| 2012/0016531 A1* | 1/2012 | Ganev | H02H 3/52 |
| | | | 700/293 |
| 2013/0286697 A1* | 10/2013 | Eiland | H02J 3/26 |
| | | | 363/71 |
| 2015/0012254 A1* | 1/2015 | Radibratovic | G05B 17/02 |
| | | | 703/2 |
| 2018/0278055 A1* | 9/2018 | Shaik | G06Q 10/0635 |
| 2021/0003974 A1* | 1/2021 | Yang | G06N 3/0455 |
| 2021/0320498 A1* | 10/2021 | Yamaguchi | H02M 7/48 |
| 2022/0115867 A1* | 4/2022 | Ratnayake | H02J 3/0012 |
| 2023/0012038 A1* | 1/2023 | Iyer | H02J 13/00006 |
| 2023/0021214 A1* | 1/2023 | Lehmer | H02S 50/10 |

* cited by examiner

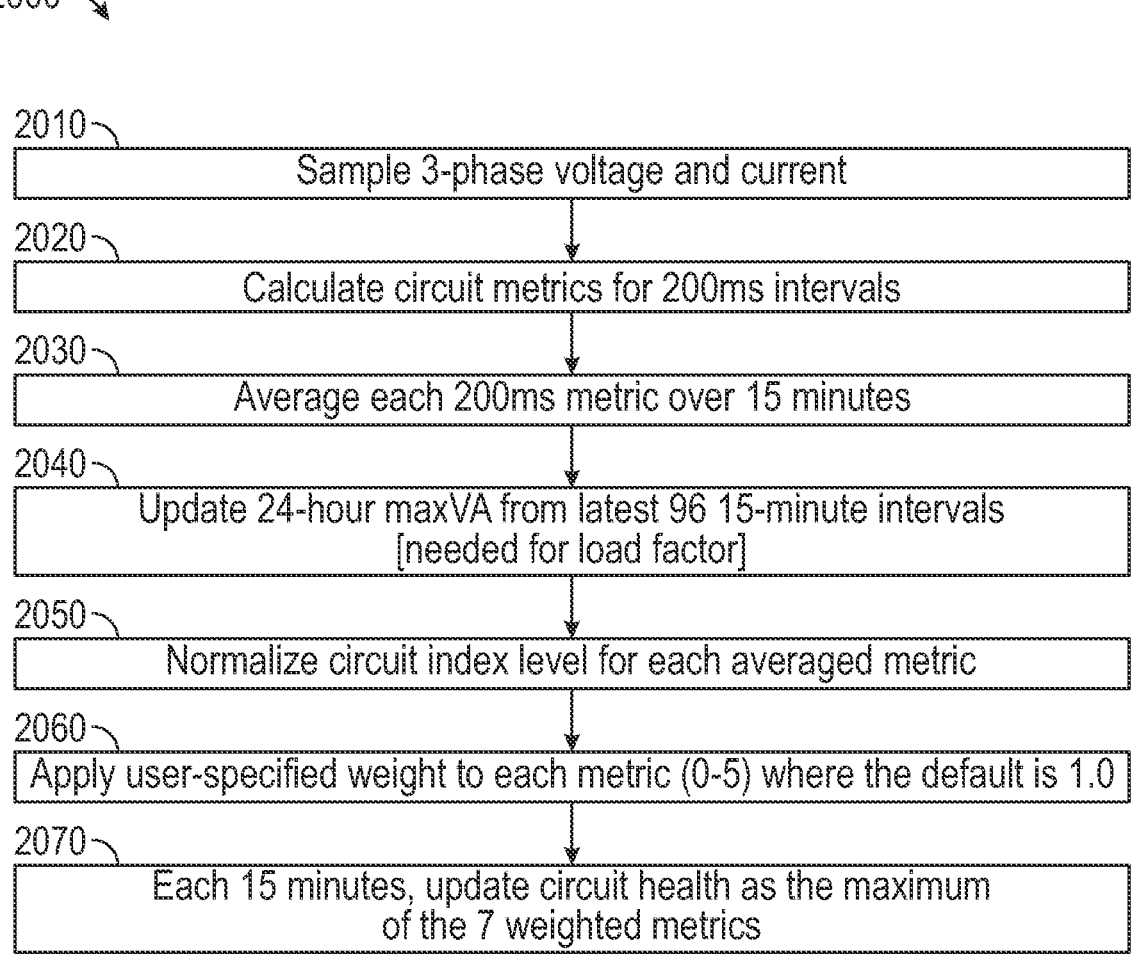

2000

2010
Sample 3-phase voltage and current

2020
Calculate circuit metrics for 200ms intervals

2030
Average each 200ms metric over 15 minutes

2040
Update 24-hour maxVA from latest 96 15-minute intervals
[needed for load factor]

2050
Normalize circuit index level for each averaged metric

2060
Apply user-specified weight to each metric (0-5) where the default is 1.0

2070
Each 15 minutes, update circuit health as the maximum
of the 7 weighted metrics

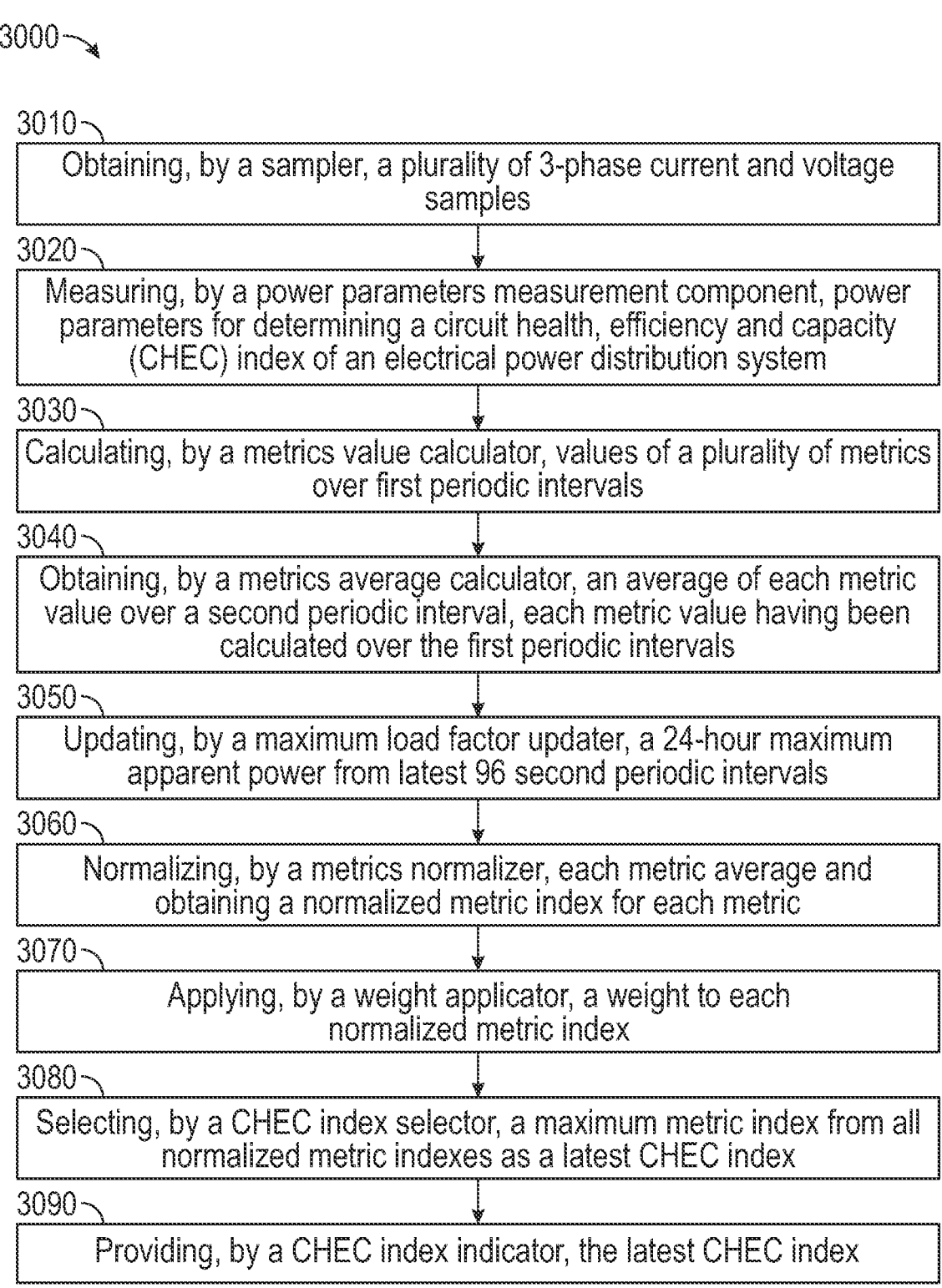

3010
Obtaining, by a sampler, a plurality of 3-phase current and voltage samples 3020
Measuring, by a power parameters measurement component, power parameters for determining a circuit health, efficiency and capacity (CHEC) index of an electrical power distribution system 3030
Calculating, by a metrics value calculator, values of a plurality of metrics over first periodic intervals 3040
Obtaining, by a metrics average calculator, an average of each metric value over a second periodic interval, each metric value having been calculated over the first periodic intervals 3050
Updating, by a maximum load factor updater, a 24-hour maximum apparent power from latest 96 second periodic intervals 3060
Normalizing, by a metrics normalizer, each metric average and obtaining a normalized metric index for each metric 3070
Applying, by a weight applicator, a weight to each normalized metric index 3080
Selecting, by a CHEC index selector, a maximum metric index from all normalized metric indexes as a latest CHEC index 3090
Providing, by a CHEC index indicator, the latest CHEC index

FIG. 5

ELECTRIC CIRCUIT HEALTH INDICATOR AND EFFICIENCY IMPROVEMENT DEVICE AND METHOD

FIELD OF THE INVENTION

The disclosed concept relates generally to a device and method of circuit health monitoring, and in particular to an electric circuit health indicator and efficiency improvement device and method.

BACKGROUND OF THE INVENTION

Various instruments for monitoring the performance of electrical power distribution systems, including power quality, are known. A wide range of instrumentation measuring individual characteristics, such as RMS currents and voltages, peak currents and voltages, power factor, current and voltage sags and swells, harmonic distortion, flicker and the like, have long been available and are in wide use. However, such individual instruments require vigilant monitoring of a multitude of separate instrument indicators, and thus undesirable electrical events are often unnoticed. In response to this, power quality monitoring instruments that monitor multiple electrical characteristics emerged. Some of these instruments attempt to provide an operator with an indication as to whether or not an overall power quality at a given time is normal for a given power system. In these instruments, an overall power quality value representative of what is normal for a given power system is arrived at through statistical analysis of summations of combinations of measurements of some electrical characteristics and quality values assigned to other electrical characteristics over time. Unfortunately, the use of a summation of measurements and as signed quality values, even when multiplied by weighting factors to control their relative importance, is susceptible to allowing an indication of a deleterious power quality event indicated by an anomaly in only one of the measurements or assigned values to be missed. To improve the efficiencies and reliability of these electrical power distribution systems, a power quality gauge has been introduced. A power quality gauge was developed to provide a single indication of the circuit health of these electrical distribution systems, but focuses on electrical events and short-term problems that could potentially be correlated with production equipment going offline or being damaged. The power quality gauge increases to the worst of quality indicators and decays over time according to two different time constants based on the concept that more recent electrical events are of immediate concern, each electrical event becoming less urgent over time.

Monitoring the efficiencies, reliability and performance of the electrical power distribution systems is a developing area of technologies.

SUMMARY OF THE INVENTION

A circuit health, efficiency and capacity (CHEC) monitor for use in an electrical power distribution system including a control panel connected to a 3-phase power source and a plurality of loads is provided. The CHEC monitor includes: a power parameters measurement component structured to measure power parameters of a power bus electrically connected to the control panel; a metrics value calculator electrically connected to the power parameters measurement component and structured to receive the measured power parameters and calculate metric values of a plurality of metrics over first periodic intervals; a metrics average calculator electrically connected to the metrics value calculator and structured to obtain an average for each metric value over a second periodic interval; a metrics normalizer electrically connected to the metrics value calculator and structured to normalize the average of each metric value and obtain a normalized metric index for each metric; a CHEC Index selector electrically connected to the metrics normalizer and structured to select a maximum metric index from the normalized metric indexes as a latest CHEC Index; and a CHEC Index indicator electrically connected to the CHEC Index selector and structured to provide the latest CHEC Index.

Another example embodiment provides a method of monitoring circuit health, efficiency and capacity (CHEC) of an electrical power distribution system including a control panel connected to a 3-phase power source and a plurality of loads. The method includes: measuring, by a power parameters measurement component, power parameters of a power bus connected to the control panel; receiving, by a metrics value calculator, the measured power parameters and calculating, by the metrics value calculator, metric values of a plurality of metrics over first periodic intervals; obtaining, by a metrics average calculator, an average of each metric value over a second periodic interval; normalizing, by a metrics normalizer, the average of each metric value and obtaining, by the metrics normalizer, a normalized metric index for each metric; selecting, by a CHEC Index selector, a maximum metric index from the normalized metric indexes as the latest CHEC Index; and providing, by a CHEC Index indicator, the latest CHEC Index.

BRIEF DESCRIPTION OF THE DRAWINGS

A full understanding of the invention can be gained from the following description of the preferred embodiments when read in conjunction with the accompanying drawings in which:

FIG. 4 is a flow chart of a method of monitoring circuit health and efficiency of an electrical power distribution system in accordance with an example embodiment of the disclosed concept; and FIG. 5 is a flow chart of a method of monitoring circuit health and efficiency of an electrical power distribution system in accordance with an example embodiment of the disclosed concept.

DETAILED DESCRIPTION OF THE INVENTION

Figure 1:
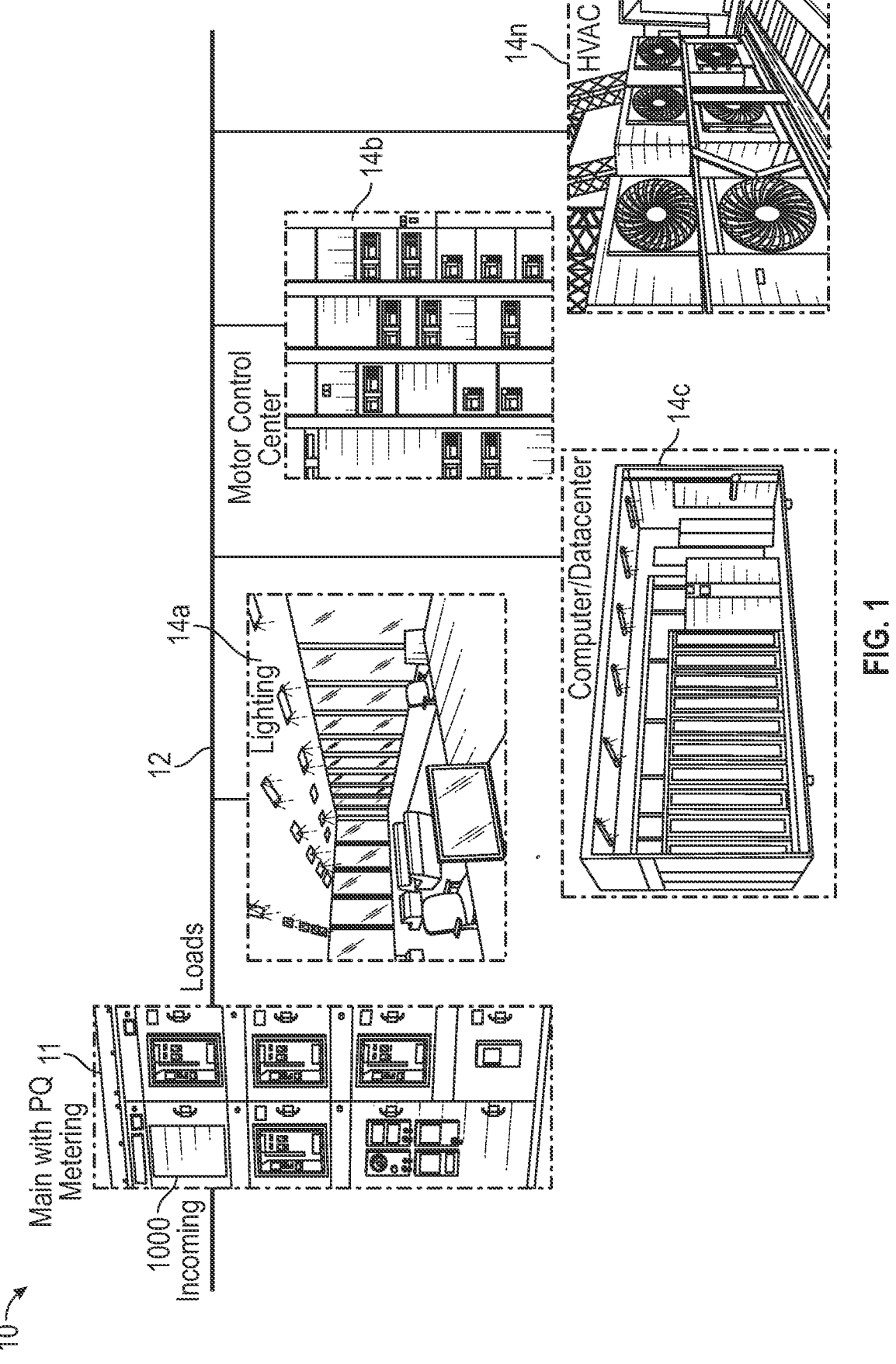
FIG. 1 is a diagram of an electrical power distribution system employing an exemplary circuit health and efficiency monitor in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

Figure 2:
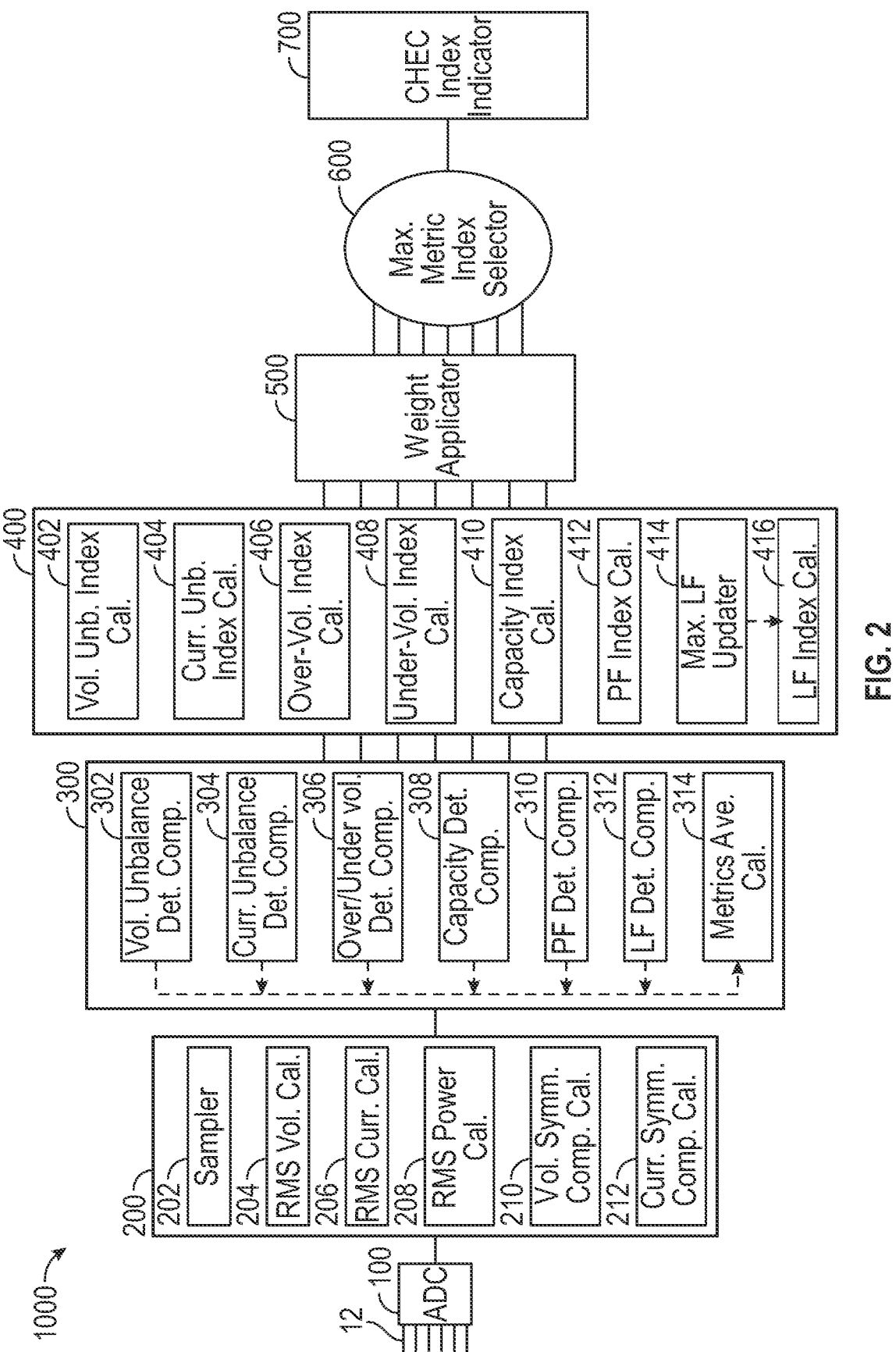
FIG. 2 is a block diagram of an exemplary circuit health and efficiency monitor in accordance with an example embodiment of the disclosed concept.
Figure 3:
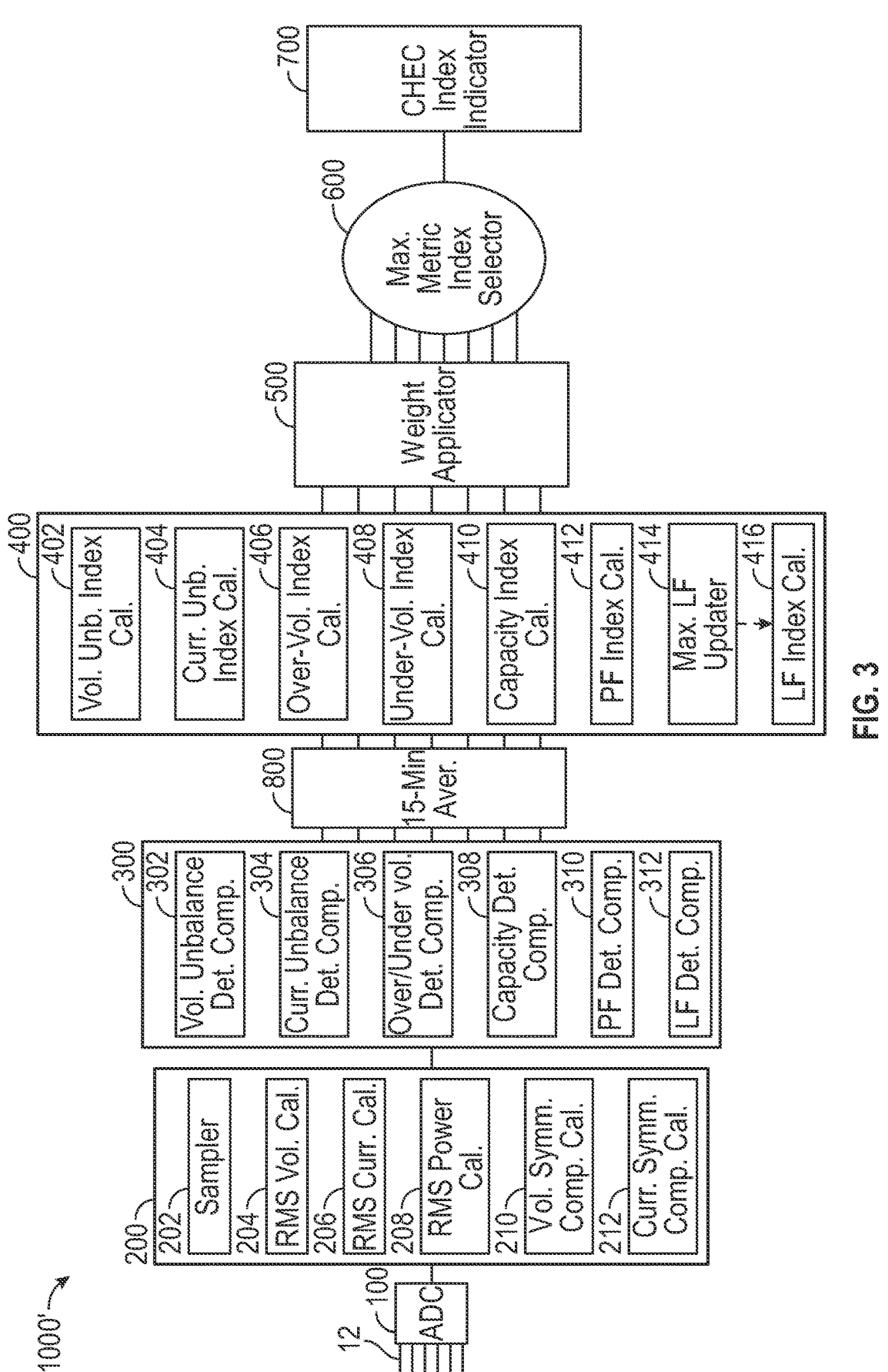
FIG. 3 is a block diagram of an exemplary circuit health and efficiency monitor in accordance with an example embodiment of the disclosed concept.

FIGS. 1-3 illustrate an electrical power distribution system 10 in accordance with non-limiting, example embodiments of the disclosed concept. FIG. 1 is a diagram illustrating an electrical power distribution system 10 including a main power control 11 and a plurality of loads 14a-n connected to the main power control 10 via a power bus 12, where n is an integer. The main power control 10 is connected to a power source (not shown) and structured to feed and control power supply to the loads 14a-n. It may be, e.g., without limitation, a control center for industrial or commercial facilities. The loads 14a-n include, e.g., without limitation, lighting 14a, an MCC (motor control center) 14b, a datacenter 14c or an HVAC systems 14n. The main power control 10 includes an exemplary circuit health, efficiency and capacity monitor 1000. It may also be communicatively coupled to a mobile user device (not shown).

FIG. 2 illustrates an exemplary circuit health, efficiency and capacity monitor 100 in accordance with a non-limiting, exemplary embodiment of the disclosed concept. The circuit health, efficiency and capacity (CHEC) monitor 1000 is connected to the power bus 12 and structured to receive data from each load 14a-n and monitor an overall circuit health, efficiency and capacity of the electrical power distribution system 1000 based at least in part on the data. The CHEC monitor 1000 includes an analog to digital converter (ADC) 100, a power parameters measurement component 200, a metrics value calculator 300, a metrics normalizer 400, a weight applicator 500, a CHEC Index selector 600, and a CHEC Index indicator 700. The ADC 100 is connected to current and voltage channels of the power bus 12 and is structured to receive analog signals indicative of a voltage level and current flow of the power bus 12. It converts the analog signals into the digital signals and transmits the digital signals to the power parameters measurement component 200. The power parameters measurement component 200, the metrics value calculator 300, the metrics normalizer 400, the weight applicator 500 and a CHEC Index selector 600 may be a processing unit that may include a processor and a memory. The processor may be, for example and without limitation, a microprocessor, a microcontroller, or some other suitable processing device or circuitry. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The memory may store current and historical power quality parameters, normalized and weighted metrics values, CHEC Indexes (the maximum index out of normalized metrics indexes calculated over a second periodic interval (e.g., without limitation, a 15 minute interval), activity logs, and/or other data associated with the CHEC monitor 1000 and the electrical power distribution system 10. While FIG. 2 shows the power parameters measurement component 200, the metrics value calculator 300, the metrics normalizer 400, the weight applicator 500 and a CHEC Index selector 600 as separate processing units, it is for illustrative purposes only, and thus alternate embodiments of the CHEC monitor 1000 may employ a single or multiple processors functioning in parallel to execute a sequence of instructions of all or some of the functions performed by the power parameters measurement component 200, the metrics value calculator 300, the metrics normalizer 400, the weight applicator 500 and a CHEC Index selector 600. For example, FIG. 3 illustrates a CHEC monitor 1000' having a separate metrics average calculator 800 structured to average the metrics over the second periodic interval (e.g., without limitation, a 15-minute interval).

Upon receiving the digital signal, the power parameters measurement component 200 is structured to measure power parameters of the power bus 12 and transmit measured power parameter values to the metrics value calculator 300. The power parameters measurement component 200 includes a sampler 202, a root-mean-square (RMS) voltage calculator 204, an RMS current calculator 206, an RMS power calculator 208, a voltage symmetrical components calculator 210, and a current symmetrical components calculator 212. The sampler 202 is structured to obtain, e.g., without limitation, at least 128 current and voltage samples per cycle. The RMS voltage calculator 204 is structured to calculate a per-phase and system RMS voltage from digital signals received from the ADC 100. For example and without limitation, the per-phase and system RMS voltage is calculated over first periodic intervals for 10 cycles at 50 Hz or 12 cycles at 60 Hz. A first periodic interval may be, e.g., without limitation, a 200 milliseconds (ms) interval. The RMS current calculator 206 is structured to calculate a per-phase and system current from digital signals received from the ADC 100. For example and without limitation, the per-phase and system current is calculated over first periodic intervals for 10 cycles at 50 Hz or 12 cycles at 60 Hz. The RMS power calculator 208 is structured to calculate 3-phase real power (Watts) and apparent power (VA) from digital signals received from the ADC 100. For example and without limitation, the 3-phase Watts and VA are calculated over the first periodic intervals for 10 cycles at 50 Hz or 12 cycles at 60 Hz. The voltage symmetrical components calculator 210 is structured to calculate positive-sequence and negative sequence symmetrical components for voltage. The current symmetrical components calculator 212 is structured to calculate positive-sequence and negative sequence symmetrical components for current. It will be understood that the calculated power parameters are provided as illustrative purpose only and a user may add or delete a power parameter based on the needs or preference without departing from the scope of the disclosed concept.

The metrics value calculator 300 is structured to receive the calculated power parameter values from the power parameters measurement component 200 and calculate metrics values based on the power parameter values. Identifying metrics relevant in determining CHEC status is one of the important benefits provided by the CHEC monitor 1000. Based on a large amount of data of real life situations and experimental results, the CHEC monitor 1000 has identified a plurality of metrics relevant to the CHEC status determination and employs these metrics in determining a latest CHEC Index indicative of an overall health of the electrical power distribution system 10 for a latest second periodic interval. The identified metrics include, e.g., without limitation, voltage unbalance, current unbalance, voltage regulation, capacity, power factor (PF), and a loading factor (LF). Excess voltage unbalance is known to wear out or damage 3-phase motors, especially with passage of time. The source of the voltage unbalance can be internal or external to the electrical power distribution system 10. A prompt detection of an excess voltage unbalance allows the user to inspect and identify the source of the voltage unbalance and perform necessary maintenance, repair or replacement before any catastrophes could take place. Thus, voltage unbalance is an important metric in determining the CHEC status. Excess current unbalance causes voltage unbalance, and thus it helps identifying the source of voltage imbalance. Voltage regulation is a measure of how controlled the average RMS voltage has been over a second periodic interval (e.g., without limitation, a 15-min interval). Capacity is a measure of the current being used relative to the available current. Power factor (PF) affects efficiency in that it is proportional to power for a given available current. Loading factor (LF) is conceived as a value that describes the shape of one or more loads 14a-n over a course of a day. An electrical power distribution system has one or more loads 14a-n that require power at different times, resulting in sudden increases or spikes in power usage throughout the day. The electrical power distribution system still needs to support such loads 14a-n, even if they draw power only for some parts of the day.

As such, the metrics value calculator 300 includes at least, e.g., without limitation, a voltage unbalance determination component 302, a current unbalance determination component 304, an over-under voltage determination component 306, a capacity determination component 308, a power factor (PF) determination component 310, and a load factor (LF) determination component 312. The voltage unbalance determination component 302 is structured to calculate a percentage of voltage unbalance as:

$$100 * \left( \text{Voltage}_{negative\_sequence} / \text{Voltage}_{positive\_sequence} \right) \qquad \text{EQ. 1}$$

The current unbalance determination component 304 is structured to calculate a percentage of current unbalance as:

$$100 * \left( \text{Current}_{negative\_sequence} / \text{Current}_{positive\_sequence} \right) \qquad \text{EQ. 2}$$

The over-under voltage determination component 306 is structured to determine that the electrical power distribution system 10 is operating at over voltage if voltage applied in the electrical power distribution system 10 is above the average voltage and that electrical power distribution system 10 is operating at under voltage if voltage applied in the electrical power distribution system 10 is below the average voltage. The capacity determination component 308 is structured to determine the overall capacity of the electrical power distribution system 10 based on a ratio of the averaged current to the rated current. The PF determination component 306 is structured to calculate system PF as Watts/VA. The LF determination component 312 is structured to determine LF as an average VA divided by the maximum or peak VA over a 24-hour period. Each of the metric values is calculated for the first periodic intervals. A first period interval may be, e.g., without limitation, a 200 ms interval. The metrics value calculator 300 further includes a metrics average calculator 314 structured to calculate an average of each metric value (e.g., without limitation, voltage unbalance, current unbalance, system voltage, system current, PF, system VA) over the second periodic interval (e.g., without limitation, a 15-minute interval) and transmit the averages of respective metrics values to the metrics normalizer 400. The 15-minute interval is sufficiently long enough to reflect transient surges or spikes that have decayed within a short amount of time (e.g., without limitation, 10 minutes) and thus present no serious problem to the operating condition for the electrical power distribution system 10. As such, the 15-minute interval allows a more reliable and accurate calculation of the CHEC Index reflective of a more comprehensive dataset, and only alerts the user if an immediate attention is required.

Normalization of each metric is essential in determining the overall health of the electrical power distribution system 10. Each metric is scaled such that, e.g., without limitation, a metric index ranging from 0 to 1 indicates that the electrical power distribution system 10 is operating in HEALTHY condition, a metric index ranging from 1 to 2 indicates that the electrical power distribution system 10 is operating in GOOD condition, a metric index ranging from 2 to 3 indicates that the electrical power distribution system 10 is operating in FAIR condition, and a metric index greater than 3 indicates that the electrical power distribution system 10 requires attention. The normalization allows each metric to have an equivalent potential for determining the overall health of the electrical power distribution system 10. It will be understood that these metric indexes are for illustrative purposes only, and thus can have different values for each condition as needed without departing from the scope of the disclosed concept.

The metrics normalizer 400 is structured to calculate peak and 24-hour averages from the averages calculated over 96 second periodic intervals, normalize each metric and obtain normalized metric index for each metric. The metrics normalizer 400 includes a voltage unbalance index calculator 402, a current unbalance index calculator 404, an over voltage index calculator 406, an under voltage index calculator 408, a capacity index calculator 410, a PF index calculator 412, a maximum LF updater 414, and an LF index calculator 416. The voltage unbalance index calculator 402 is structured to calculate voltage unbalance index as:

$$\text{Voltage Unblance Index} = 2 * V_{Unbalance} \% \qquad \text{EQ. 3}$$

where 2 is a scale value for obtaining voltage unbalance index. The current unbalance index calculator 402 is structured to calculate current unbalance index as:

$$\text{Current Unblance Index} = 0.5 * I_{Unbalance} \% \qquad \text{EQ. 4}$$

where 0.5 is a scale value for obtaining current unbalance index. The over voltage index calculator 406 is structured to calculate over voltage index as:

$$\text{Over Voltage Index} = 3.3 * \max(V_{average} - V_{nominal}, 0) \qquad \text{EQ. 5}$$

where 3.3 is a scale value for obtaining over voltage index. The under voltage index calculator 408 is structured to calculate under voltage index as:

$$\text{Under Voltage Index} = 0.2 * \max(V_{nominal} - V_{average}, 0) \qquad \text{EQ. 6}$$

where 0.2 is a scale value for obtaining under voltage index. The capacity index calculator 410 is structured to calculate the capacity index as:

$$\text{Capacity Index} = 3.75 * (I_{average} / I_{rated}) \qquad \text{EQ. 7}$$

where 3.75 is a scale value for obtaining capacity index. The PF index calculator 412 is structured to calculate the PF index as:

$$PF \text{ Index} = 8 * (1 - PF_{average}) \qquad \text{EQ. 8}$$

where 8 is a scale value for obtaining PF index. The maximum LF updater 414 is structured to update a 24-hour maximum VA from the latest 96 second periodic intervals and the LF index calculator 414 is structured to calculate the LF index as:

$$LF \text{ Index} = 9 * (1 - LF) \text{ where } LF = VA_{average} / VA_{peak} \qquad \text{EQ. 9}$$

where 9 is a scale value for obtaining LF index and $VA_{peak}$ is the 24-hour maximum VA from the latest 96 second periodic intervals. Each metric index is initially scaled such that the calculated metric index is 3.0 for a circumstance that needs attention in accordance with IEC, IEEE and ANSI standards. That is, initially the voltage unbalance index calculator 402 returns the voltage unbalance index greater than 3 if the voltage unbalance is greater than 15%, the current unbalance index calculator 404 returns the current unbalance index greater than 3 if the current unbalance is greater than 6%, the over-voltage index calculator 406 returns the over voltage index greater than 3 if the over voltage exceeds 9% of the average voltage, the under voltage index calculator 408 returns the under voltage index greater than 3 if the under voltage exceeds 15% of the average voltage, the capacity index calculator 410 returns the capacity index greater than 3 if the capacity is greater than 80% of the rated current, the PF index calculator 412 returns the PF index greater than 3 if the PF is less than 0.625, and the LF index calculator returns the LF index greater than 3 if the LF is less than 0.667.

The weight applicator 500 is structured to apply a weight to each metric index calculated. The weights may be provided by the user. A zero weight turns off a selected metric, a 0.5 weight halves the sensitivity of the selected metric in determining the overall circuit health and efficiency, and a 2.0 weight doubles the sensitivity. The default weight is 1.0. Upon application of the weights, the weight applicator 500 transmits the weighted normalized metrics indexes to the CHEC Index selector 600. The CHEC Index selector 600 is structured to select a maximum index out of the weighted normalized metrics indexes as the latest CHEC Index indicative of the overall health of the electrical power distribution system 10 during the latest second periodic interval (i.e., the latest 15-minute interval). The CHEC Index selector 600 is also structured to update the CHEC Index for every second periodic interval. The CHEC index indicator 700 is structured to provide the latest CHEC Index on a display of the CHEC monitor 1000 or in a mobile user device communicatively coupled to the CHEC monitor 1000. The CHEC index indicator 700 may also alert the user if the CHEC Index is a value requiring immediate attention for inspection (e.g., without limitation, greater than 3), thereby allowing the user to inspect, identify and/or repair a source presenting a potential problem within or without the electrical power distribution system 10.

FIG. 3 illustrates an exemplary circuit health, efficiency and capacity (CHEC) monitor 1000' in accordance with a non-limiting, exemplary embodiment of the disclosed concept. The CHEC 1000' is similar to the CHEC monitor 1000 of FIG. 2, except that it includes a separate metrics average calculator 800. The metric average calculator 800 obtains the calculated metrics values from the metrics value calculator 300 and obtains an average of each metrics value (which had been measured over first periodic intervals) over the second periodic interval and transmits the metrics value averages to the normalizer 400 for normalizing metrics indexes.

Accordingly, the inventive circuit health, capacity and efficiency monitor 1000,1000' not only condenses the overall circuit health, capacity and efficiency (CHEC) of an electrical power distribution system into a single CHEC Index from a set of normalized and weighted metrics in accordance with the user's needs and/or preferences, but also provides the user an immediate opportunity for optimizing capacities and maximizing efficiencies of the circuits in the electrical power distribution system. By selecting the maximum weighted normalized index of all of the weighted normalized indexes as the latest CHEC Index, the CHEC monitor allows the user to view and immediately recognize what metric is presenting or may present potential issues and/or damages. For example, if the capacity index is selected as the latest CHEC Index (due to the capacity index being a maximum weighted normalized metric index over the remaining weighted normalized metrics indexes), the user can immediately understand that the power is being over drawn or wasted and perform appropriate actions to decrease or increase the capacity of the electrical power distribution system 10. In another example, if the voltage unbalance index is selected as the latest CHEC Index, the user can immediately inspect and identify the source of the voltage unbalance and perform appropriate actions, e.g., maintenance, repair, replacement or alert appropriate person if the voltage unbalance is associated with an external source. Further, the CHEC monitor ensures that all of the loads requiring power during only part of the day (e.g., peak hours) are fully supplied with power even if some of the loads require power for a brief period during the day. Further, the latest CHEC Index is determined based on averaging, normalizing and scaling relevant metrics over a latest second periodic interval (e.g., without limitation, a 15-minute interval) that is sufficiently long enough to moot the effects of transient events that have decayed or resolved within a short period, thereby alerting the user only when a power quality event poses an actual risk or damage to the operation of the electrical power distribution system 10 unlike the conventional power quality monitors that monitors instantaneous power quality events and alerts the user of any transient power quality events without taking into consideration of the fact that the transients power quality events may have already been decayed and thus resolved.

FIG. 4 is a flow chart of a method 2000 for monitoring circuit health, efficiency and capacity of an electrical power distribution system in accordance with a non-limiting, example embodiment of the disclosed concept. The method 2000 may be performed by the circuit health, efficiency and capacity monitor 1000,1000' and/or any components thereof.

At 2010, a sampler obtains 3-phase voltage and current samples.

At 2020, a power parameters measurement component calculates values for a plurality of circuit metrics over first periodic intervals. A first periodic interval may be, e.g., without limitation, a 200 ms interval.

At 2030, a metrics average calculator obtains an average of each metric value, each metric value having been measured at first periodic intervals (e.g., without limitation, 200 ms periodic intervals) over a second periodic interval. The second periodic interval may be, e.g., without limitation, a 15-minute interval.

At 2040, a maximum load factor updater updates a 24-hour maximum apparent power from the latest 96 second periodic intervals.

At 2050, a metrics normalizer normalizes metrics index for each averaged metric.

At 2060, a weight applicator applies a weight to each normalized metric index.

At 2070, a CHEC Index selector determines a latest CHEC Index indicative of the overall health of the electrical power distribution system in the latest second periodic interval and updates the CHEC Index at every second periodic interval, the CHEC Index being the maximum of the weighted normalized metrics indexes.

FIG. 5 is a flow chart of a method 3000 for monitoring circuit health, efficiency and capacity of an electrical power distribution system in accordance with a non-limiting, example embodiment of the disclosed concept. The method 3000 may be performed by the circuit health, efficiency and capacity monitor 1000,1000' and/or any components thereof.

At 3010, a sampler obtains 3-phase voltage and current samples.

At 3020, a power parameters measurement component measures power parameters for determining a latest CHEC Index of an electrical power distribution system, the latest CHEC Index indicative of the overall health of the electrical power distribution system over the latest second periodic interval. The second periodic interval may be sufficiently long enough to reflect a transient power quality event that has decayed over a brief period (e.g., without limitation, less than 10 minutes) in determining the CHEC Index. The power parameters are measured over a plurality of first periodic intervals. A first periodic interval may be, e.g., without limitation, 200 ms periodic interval.

At 3030, a metrics value calculator calculates values of a plurality of metrics over the first periodic intervals.

At 3040, a metrics average calculator obtains an average of each metric value over the second periodic interval, each metric value having been calculated over the first periodic intervals.

At 3050, a maximum load factor updater updates a 24-hour maximum apparent power from the latest 96 second periodic intervals.

At 3060, a metrics normalizer normalizes each metric average and obtains a normalized metric index for each metric. For normalization, each metric index is scaled.

At 3070, a weight applicator applies a weight to each normalized metric index. Weights may be specified by the user. A zero weight turns off a selected metric, a 0.5 weight halves the sensitivity of the selected metric in determining the overall CHEC, and a 2.0 weight doubles the sensitivity. The default weight is 1.0.

At 3080, a CHEC Index selector selects a maximum metric index from all (weighted) normalized metric indexes as a latest CHEC Index. The CHEC Index selector also updates the CHEC Index at every second periodic interval.

At 3090, a CHEC Index indicator provides the latest CHEC Index on a display of the CHEC monitor or in a mobile user device communicatively coupled to the CHEC monitor.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A circuit health, efficiency and capacity (CHEC) monitor for use in an electrical power distribution system including a control panel connected to a 3-phase power source and a plurality of loads, the CHEC monitor comprising:
   a power parameters measurement component structured to measure power parameters of a power bus electrically connected to the control panel;
   a metrics value calculator electrically connected to the power parameters measurement component and structured to receive the measured power parameters and calculate metric values of a plurality of metrics over first periodic intervals;
   a metrics average calculator electrically connected to the metrics value calculator and structured to obtain an average for each metric value over a second periodic interval;
   a metrics normalizer electrically connected to the metrics value calculator and structured to normalize the average for each metric value and obtain a normalized metric index for each metric;
   a CHEC Index selector electrically connected to the metrics normalizer and structured to select a maximum metric index from the normalized metric indexes as a latest CHEC Index; and
   a CHEC Index indicator electrically connected to the CHEC Index selector and structured to provide the latest CHEC Index,
   wherein the metric value calculator comprises a voltage unbalance determination component, a current unbalance determination component, an over-under voltage determination component, a capacity determination component, a power factor (PF) determination component, and a loading factor (LF) determination component,
   wherein the over-under voltage determination component is structured to determine that the electrical power distribution system is operating at over voltage based on a determination that voltage applied is above average voltage and that the electrical power distribution system is operating at under voltage based on a determination that voltage applied is below the average voltage.

2. The CHEC monitor of claim 1, further comprising:
   a weight applicator electrically connected to the metrics normalizer and the CHEC Index selector and structured to apply a weight to each normalized metric index and transmit the weighted normalized metric indexes to the CHEC Index selector.

3. The CHEC monitor of claim 1, wherein the power parameters measurement component comprises:
   a sampler structured to obtain a plurality of current and voltage samples per cycle;

a root-mean-square (RMS) voltage calculator structured to calculate a per-phase and system RMS voltage;

an RMS current calculator structured to calculate a per-phase and system RMS current;

an RMS power calculator structured to calculate 3-phase real power (Watts) and apparent power (VA);

a voltage symmetrical components calculator structured to calculate positive-sequence and negative sequence symmetrical components for voltage; and a current symmetrical components calculator structured to calculate positive sequence and negative sequence symmetrical components for current.

4. The CHEC monitor of claim 1, wherein the voltage unbalance determination component is structured to calculate a percentage of voltage unbalance as:

$$100 * \left( \text{Voltage}_{negative\_sequence} / \text{Voltage}_{positive\_sequence} \right),$$

and wherein the current unbalance determination component is structured to calculate a percentage of current unbalance as:

$$100 * \left( \text{Current}_{negative\_sequence} / \text{Current}_{positive\_sequence} \right).$$

5. The CHEC monitor of claim 1, wherein the capacity determination component is structured to determine an overall capacity of the electrical power distribution system based on a ratio of averaged current to the rated current, wherein the PF determination component is structured to calculate a system PF as Watts/VA, and wherein the LF determination component is structured to determine an LF as an average VA divided by the maximum or peak VA over a 24-hour period.

6. The CHEC monitor of claim 1, wherein the metrics normalizer includes a voltage unbalance index calculator, a current unbalance index calculator, an over voltage index calculator, an under voltage index calculator, a capacity index calculator, a PF index calculator, a maximum LF updater and an LF index calculator.

7. The CHEC monitor of claim 6, wherein the voltage unbalance index calculator is structured to calculate:

Voltage Unblance Index=$2*V_{Unbalance}$ %, where 2 is a scale value and $V_{Unbalance}$ % is a percentage of voltage unbalance, wherein the current unbalance index calculator is structured to calculate:

Current Unblance Index=$0.5*I_{Unbalance}$ %, where 0.5 is a scale value and $I_{Unbalance}$ % is a percentage of current unbalance, wherein the over voltage index calculator is structured to calculate:

Over Voltage Index=$3.3*\max(V_{average}-V_{nominal},0)$, where 3.3 is a scale value, $V_{average}$ is an average voltage, and $V_{nominal}$ is a nominal voltage, wherein the under voltage index calculator is structured to calculate:

Under Voltage Index=$0.2*\max(V_{nominal}-V_{average}, 0)$, where 0.2 is a scale value, wherein the capacity index calculator is structured to calculate:

Capacity Index=$3.75*(I_{average}/I_{rated})$, where 3.75 is a scale value, $I_{average}$ is an average current, and $I_{rated}$ is a rated current, wherein the PF index calculator is structured to calculate:

PF Index=$8*(1-PF_{average})$, where 8 is a scale value and $PF_{average}$ is an average PF, wherein the maximum LF updater is structured to update a 24-hour maximum VA from the latest 96 second periodic intervals, and wherein the LF index calculator is structured to calculate:

LF Index=$9*(1-LF)$ where LF=$VA_{average}/VA_{peak}$, where 9 is a scale value, $VA_{average}$ is an average VA, and $VA_{peak}$ is a maximum or peak VA.

8. The CHEC monitor of claim 1, wherein the first periodic interval is a 200 ms interval and the second periodic interval is a 15 minute interval.

9. The CHEC monitor of claim 1, wherein the second periodic interval is of a duration in which a transient power quality event is resolved such that a user is not alerted about an already decayed or resolved transient power quality event during the second periodic interval.

10. The CHEC monitor of claim 1, wherein the CHEC Index selector is further structured to update the CHEC Index for every second periodic interval.

11. The CHEC monitor of claim 1, wherein the CHEC Index indicator provides the latest CHEC index on a display of the CHEC monitor and/or a display of a mobile user device communicatively coupled to the CHEC monitor.

12. The CHEC monitor of claim 1, wherein the CHEC Index indicator provides a user an immediate opportunity for optimizing capacities and maximizing efficiencies of circuits within the electrical power distribution system.

13. A method of monitoring circuit health, efficiency and capacity (CHEC) of an electrical power distribution system including a control panel connected to a 3-phase power source and a plurality of loads, the method comprising:

measuring, by a power parameters measurement component, power parameters of a power bus electrically connected to the control panel;

receiving, by a metrics value calculator, the measured power parameters and calculating, by the metrics value calculator, metric values of a plurality of metrics over first periodic intervals;

obtaining, by a metrics average calculator, an average for each metric value over a second periodic interval;

normalizing, by a metrics normalizer, the average for each metric value and obtaining, by the metrics normalizer, a normalized metric index for each metric;

selecting, by a CHEC Index selector, a maximum metric index from the normalized metrics indexes as a latest CHEC Index; and providing, by a CHEC Index indicator, the latest CHEC Index, wherein the metric value calculator comprises a voltage unbalance determination component, a current unbalance determination component, an over-under voltage determination component, a capacity determination component, a power factor (PF) determination component, and a loading factor (LF) determination component, wherein the over-under voltage determination component is structured to determine that the electrical power distribution system is operating at over voltage based on a determination that voltage applied is above average voltage and that the electrical power distribution system is operating at under voltage based on a determination that voltage applied is below the average voltage.

14. The method of claim 13, further comprising:

applying, by a weight applicator, a weight to each normalized metric index and transmitting, by the weight applicator, the weighted normalized metric index to the CHEC Index selector, wherein the weight is determined by a user.

15. The method of claim 13, wherein measuring, by the power parameters measurement component, power parameters comprises:

obtaining, by a sampler, a plurality of current and voltage samples per cycle;

calculating, by a root-mean-square (RMS) voltage calculator, a per-phase and system RMS voltage;

calculating, by an RMS current calculator, a per-phase and system RMS current;

calculating, by an RMS power calculator, 3-phase real power (Watts) and apparent power (VA);

calculating, by a voltage symmetrical components calculator, positive sequence and negative sequence symmetrical components for voltage; and calculating, by a current symmetrical components calculator, positive sequence and negative sequence symmetrical components for current.

16. The method of claim 13, wherein calculating, by the metrics value calculator, metric values of a plurality of metrics over first periodic intervals comprises:

calculating, by the voltage unbalance determination component, a percentage of voltage unbalance as:

$$100 * \left( \text{Voltage}_{negative\_sequence} / \text{Voltage}_{positive\_sequence} \right),$$

and calculating, by the current unbalance determination component, a percentage of current unbalance as:

$$100 * \left( \text{Current}_{negative\_sequence} / \text{Current}_{positive\_sequence} \right),$$

determining, by the capacity determination component, an overall capacity of the electrical power distribution system based on a ratio of averaged current to the rated current;

calculating, by the power factor (PF) determination component, a system PF as Watts/VA; and determining, by the loading factor (LF) determination component, an LF as an average VA divided by the maximum or peak VA over a last 24-hour period.

17. The method of claim 13, wherein normalizing, by a metrics normalizer the average for each metric value and obtaining, by the metrics normalizer, a normalized metric index for each metric includes:

calculating, by a voltage unbalance index calculator:

Voltage Unblance Index=$2 * V_{Unbalance}$ %, where 2 is a scale value and $V_{Unbalance}$ % is a percentage of voltage unbalance;

calculating, by a current unbalance index calculator:

Current Unblance Index=$0.5 * I_{Unbalance}$ %, where 0.5 is a scale value and $I_{Unbalance}$ % is a percentage of current unbalance;

calculating, by an over voltage index calculator:

Over Voltage Index=$3.3 * \max(V_{average} - V_{nominal}, 0)$, where 3.3 is a scale value, $V_{average}$ is an average voltage, and $V_{nominal}$ is a nominal voltage;

Under Voltage Index=$0.2 * \max(V_{nominal} - V_{average}, 0)$, where 0.2 is a scale value;

calculating, by a capacity index calculator:

Capacity Index=$3.75 * (I_{average} / I_{rated})$, where 3.75 is a scale value, $I_{average}$ is an average current, and $I_{rated}$ is a rated current;

calculating, by a PF index calculator:

PF Index=$8 * (1 - PF_{average})$, where 8 is a scale value and $PF_{average}$ is an average PF;

updating, by a maximum LF updater, the 24-hour maximum VA from the latest 96 second periodic intervals, and calculating, by an LF index calculator:

LF Index=$9 * (1 - LF)$ where LF=$VA_{average} / VA_{peak})$, where 9 is a scale value, $VA_{average}$ is an average VA, and $VA_{peak}$ is a maximum or peak VA.

18. The method of claim 13, wherein the CHEC Index indicator provides a user an immediate opportunity for optimizing capacities and maximizing efficiencies of circuits within the electrical power distribution system.

* * * * *